(12) United States Patent
Chu et al.

(10) Patent No.: US 6,522,986 B1
(45) Date of Patent: Feb. 18, 2003

(54) APPARATUS AND METHOD FOR TESTING PROCESSING CIRCUIT FOR JOYSTICK BUTTONS

(75) Inventors: Chia-Chin Chu, Taipei (TW); Wen-Lung Hsu, Taipei (TW)

(73) Assignee: Via Technologies, Inc., Taipei (TW)

( * ) Notice: Subject to any disclaimer, the term of this patent is extended or adjusted under 35 U.S.C. 154(b) by 177 days.

(21) Appl. No.: 09/632,086

(22) Filed: Aug. 2, 2000

(30) Foreign Application Priority Data

Nov. 24, 1999 (TW) ........................... 88120489 A

(51) Int. Cl.[7] .............................. G01R 29/02
(52) U.S. Cl. .................... 702/117; 273/148 B
(58) Field of Search ............... 273/148 B; 345/161; 702/117; 439/912

(56) References Cited

PUBLICATIONS

Engdal, Tomi, "Joysticks and other game controllers", 1996–1998, ePanorama.net—Joystick Documents (http://www.epanorama.net/documents/joystick/index.html).*

* cited by examiner

Primary Examiner—Marc S. Hoff
Assistant Examiner—Edward Raymond

(57) ABSTRACT

An apparatus for testing a main board processing circuit for joystick buttons. The apparatus is used for testing the processing circuit of a main board, wherein the processing circuit is coupled to the joystick through a connector. The apparatus contains a test tool and a short-circuit node, wherein the test tool contains M pins, corresponding to M pins of the connector, for coupling the test tool with the connector. N pins of the M pins of the test tool correspond to the N pins of the connector, which are connected to the buttons. The short-circuit node is the common node of the N pins that are all short-circuited for simulating the actions of the joystick buttons. In the test, the connector is firstly connected to the test tool and the status values stored in a status register are detected. The connection is then disconnected from the test tool.

19 Claims, 3 Drawing Sheets

APPARATUS AND METHOD FOR TESTING PROCESSING CIRCUIT FOR JOYSTICK BUTTONS

BACKGROUND OF THE INVENTION

This application incorporates by reference Taiwanese application Serial No. 88120489, filed Nov. 24, 1999.

1. Field of the Invention

The invention relates in general to a method and apparatus for testing a processing circuit for signals from buttons of joysticks, and more particularly to a method and apparatus for testing the processing circuit, in the production line of personal computers (PCs) and games, for signals from buttons of joysticks.

2. Description of the Related Art

As PCs become more popular, joysticks have also become an increasingly popular peripheral for them. During the manufacturing of PC main boards, specific tests must be done in the production lines to test their functionality. The main boards passing these tests are then approved to be distributed to the customers. One of the most important tests involves the testing of the interfaces, including its related built-in circuits, which the main boards use to communicate with the joysticks.

For the test of the above-mentioned components, a PC manufacturer will commonly include a joystick testing stage within the production line. The tests utilizes a test tool to simulate the actions of the joystick. A joystick generally contains a X-coordinate position control, Y-coordinate position control, and two buttons, all of which are controlled by a user. Generally, only the main board circuits relating to the X- and Y-coordinate position controls are tested while those related to the buttons are not. As such, if the circuits relating to the buttons are to be tested, an additional joystick button testing stage will need to be installed into the production line. The new test will need to involve either directly connecting a joystick onto the main board and a tester operates the joystick for testing, or the development of a new test tool that simulates the actions of the joystick buttons. Regardless of the method employed, the testing of the main board components will be complicated and also result in a waste of time and manpower.

SUMMARY OF THE INVENTION

It is therefore an object of the invention to provide a method and apparatus for testing the main board circuitry which processes the joystick button signals in an efficient manner. The invention is an improvement on the test tool currently used to test the circuits related to the X- and Y-coordinate position controls. In this way, the testing of the circuitry related to the joystick buttons can be completed during the testing of the position controls. The method is not only simple and inexpensive, but no additional time needs to be invested.

In accordance with an aspect of the invention, an apparatus of testing a processing circuit for joystick buttons is provided. It is used for outputting the signals of a joystick buttons and that of the X- and Y-coordinate position controls into the processing circuit of a main board for testing. The processing circuit is coupled to the joystick by a connector, which contains M first pins. N pins of the M first pins are used for the connection of the processing circuit with the buttons. The apparatus contains a test tool with M second pins and a short-circuit node. The M second pins of the test tool correspond to the M first pins of the connector for the connection with the connector, wherein N pins of the M second pins corresponds to the N first pins of the connector. The short-circuit node is used as the common node of the N short-circuited second pins and is used to simulate the actions of the buttons.

In accordance with another aspect of the invention, a method of testing a processing circuit for joystick buttons is provided. Signals of a number of joystick buttons and the X- and Y-coordinate position controls are outputted into the main board. The processing circuit on the main board is coupled to the joystick via a connector containing M first pins of which N pins are used for the joystick buttons. The method includes the steps as follows. First, the pins of the test tool, corresponding to the N pins of the connector, are shorted out. The test tool is then connected to the connector and the status values stored in the status register that corresponds to the joystick buttons are determined. Finally, the test tool is disconnected with the connector and the status values stored in the status register that corresponds to the buttons are determined again.

BRIEF DESCRIPTION OF THE DRAWINGS

Other objects, features, and advantages of the invention will become apparent from the following detailed description of the preferred but non-limiting embodiments. The description is made with reference to the accompanying drawings in which.

DESCRIPTION OF THE PREFERRED EMBODIMENT

When a joystick is installed into a computer system (or a game station), a joystick driver (or application program) for dealing with the joystick's data is executed in the computer system including a controlling circuit between the main board of the computer system and the joystick. For the illustration of the principle of the invention, the principle of the connection and interaction of the joystick and the controlling circuit is first described.

Figure 1:
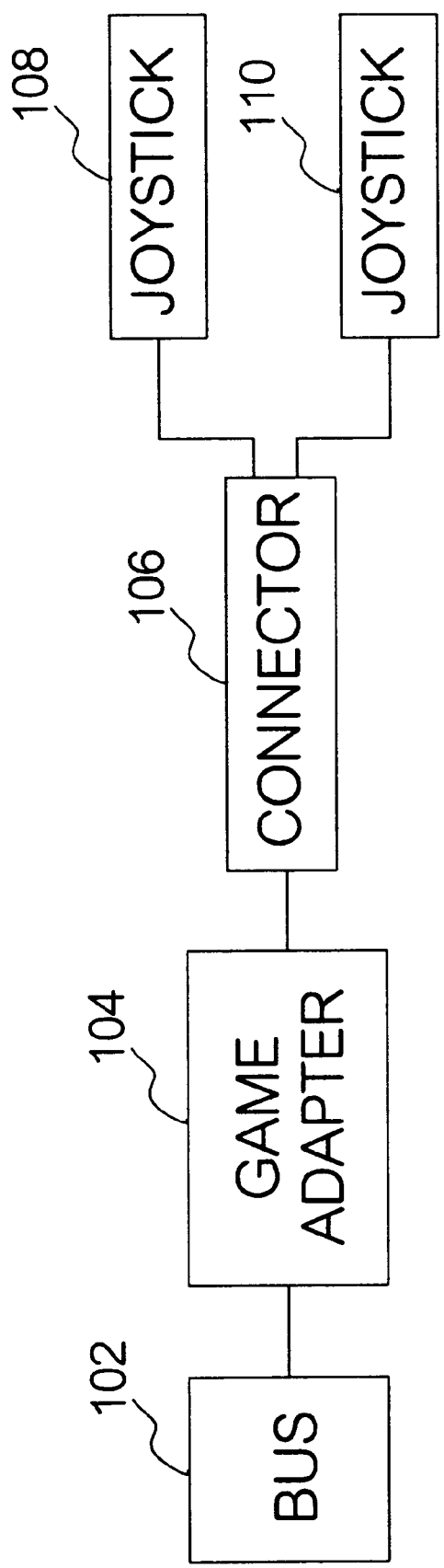
FIG. 1 (Prior Art) shows the block diagram of a controlling circuit between the bus of a main board and a joystick.

Referring now to FIG. 1, which contains a block diagram of a controlling circuit between a joystick and the bus 102 of a main board of a computer system, the controlling circuit includes a game adapter 104 and a connector 106. The game adapter 104 further contains a buffer (not shown in FIG. 1) and a multi-vibrator (not shown in FIG. 1). The buffer is used for storing the current button status sent from the joystick while the multi-vibrator is used to determine the position indicated by the joystick. The game adapter 104 is connected to joysticks 108 and 110 through the connector 106. The controlling signals of joysticks 108 and 110 are processed by the game adapter 104 and transferred to other parts of the computer system for further processing through the bus 102.

Figure 2:
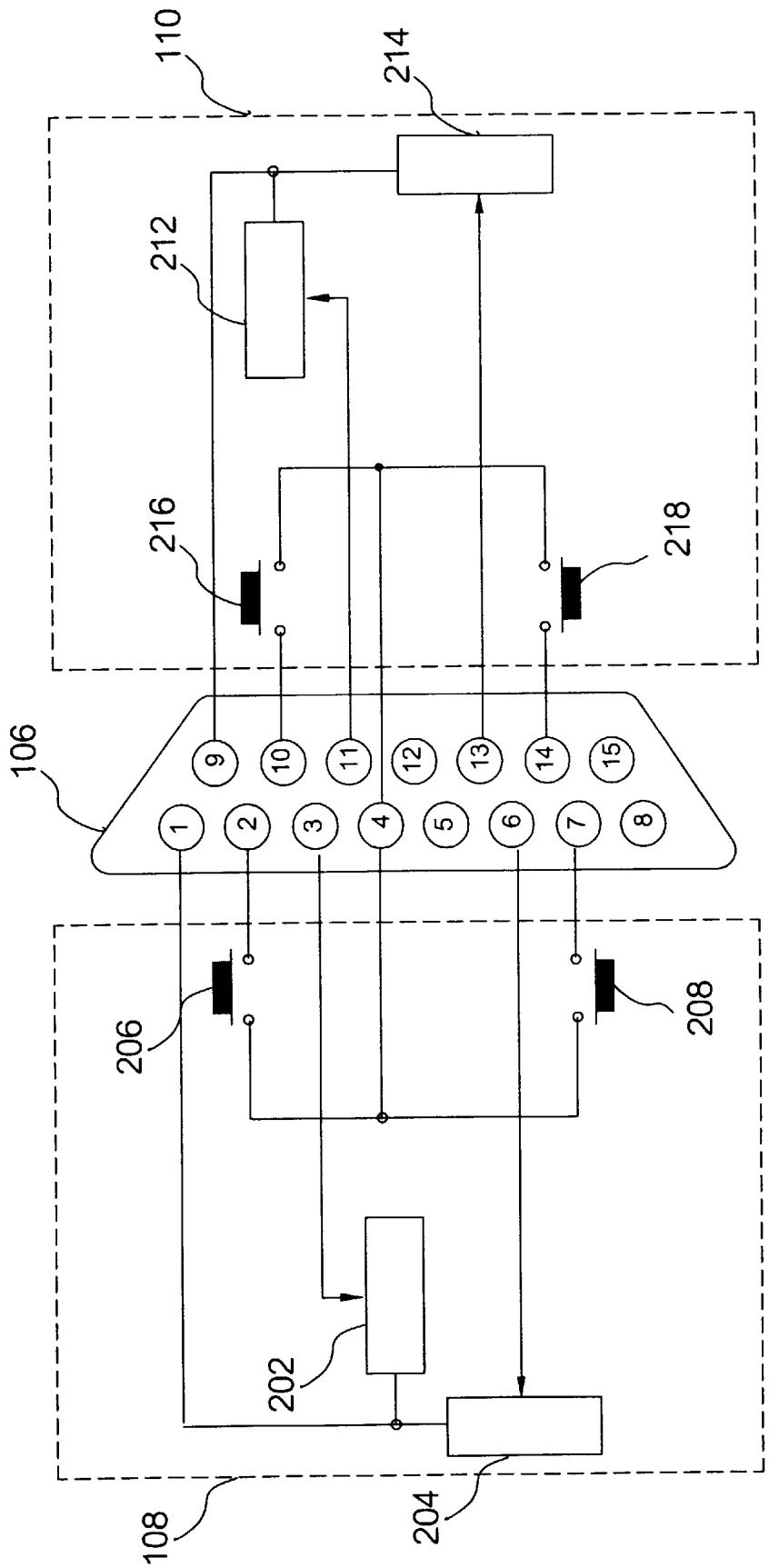
FIG. 2 (Prior Art) is the circuit diagram showing the wiring between the connector and the joystick described in FIG. 1.

Referring now to FIG. 2, it illustrates the wiring between the connector and the joystick as described in FIG. 1. It shows the interconnection of the joysticks 108 and 110 with the connector 106. The joystick 108 contains X-potentiometer 202, Y-potentiometer 204, button 206, and button 208. As the joystick position is changed, the values of the X-potentiometer 202 and Y-potentiometer 204 are changed as well, corresponding to the displacement of the X and Y coordinate of the joystick 108. The joystick 110 contains X-potentiometer 212, Y-potentiometer 214, button 216, and button 218. Similarly, as the joystick position is changed, the values of the X-potentiometer 212 and Y-potentiometer 214 are changed as well, corresponding to the displacement of the X and Y coordinate of the joystick 110.

The usage of the pins of the connector 106 is depicted in Table A as follows.

TABLE A

| Pin | Used for |
| --- | --- |
| 1, 8, 9 | connecting to supply voltage Vcc (+5 V) |
| 4, 5 | connecting to ground GND (0 V) |
| 2 | connecting to the button 206 of the joystick 108 |
| 3 | connecting to the X-potentiometer 202 of the joystick 108 |
| 6 | connecting to the Y-potentiometer 204 of the joystick 108 |
| 7 | connecting to the button 208 of the joystick 108 |
| 10 | connecting to the button 216 of the joystick 110 |
| 11 | connecting to the X-potentiometer 212 of the joystick 110 |
| 13 | connecting to the Y-potentiometer 214 of the joystick 110 |
| 14 | connecting to the button 218 of the joystick 110 |

In addition, the game adapter has a status register for storing the current status of the joysticks 108 and 110, in which each bit of the status register represents different meanings. The usage of the bits of the status register is described in Table B.

TABLE B

| Bit | Used for |
| --- | --- |
| 0 | storing the status of the X-potentiometer 202 of the joystick 108 |
| 1 | storing the status of the Y-potentiometer 204 of the joystick 108 |
| 2 | storing the status of the X-potentiometer 212 of the joystick 110 |
| 3 | storing the status of the Y-potentiometer 214 of the joystick 110 |
| 4 | storing the status of the button 206 of the joystick 108 |
| 5 | storing the status of the button 208 of the joystick 108 |
| 6 | storing the status of the button 216 of the joystick 110 |
| 7 | storing the status of the button 218 of the joystick 110 |

The X-potentiometer 202 will be used as the example for explaining the principle in which the X- and Y-coordinate displacements are detected. The X-potentiometer 202 is regarded as a variable resistor and so as the position of the joystick 108 changes in the X-coordinate, the resistance value of the X-potentiometer 202 will change as well. For instance, the maximum resistance value corresponds to the extreme right side in the X-coordinate of the joystick while the minimum resistance value corresponds to the extreme left side in the X-coordinate. The X-potentiometer 202 is connected to a capacitor (not shown in FIG. 2) of the game adapter 104, in which the capacitor is charged and discharged according to the X-potentiometer 202. Different displacements of the joystick correspond to different resistance values, which further correspond to different values of capacitor charging/discharging time. The relationship between them can be obtained by experiments.

The joystick driver (or application program) of the computer system has to continuously detect the status of the joystick and writes the value corresponding to the status into the status register for triggering some actions. For instance, when bit 0 of the status register is 1, it triggers a timer, leading to the discharge of the capacitor. When the potential of the discharging capacitor is below a threshold value, the bit 0 of the status register is set to 0. The value of the timer is then converted into a digital signal corresponding to the X-coordinate displacement of the joystick. Likewise, the operating principles of the Y-potentiometer 204, X-potentiometer 212, and Y-potentiometer 214 are analogous to that of the X-potentiometer 202.

When the bit 4 is 0, it indicates that button 206 of the joystick 108 is pressed. When the bits 5, 6, and 7 are equal to 0 each, it indicates the buttons 208 of the joystick 108, the buttons 216 and 218 of the joystick 110 are pressed respectively.

In the design of the test tool for testing the processing circuit for joysticks on main boards in the production line, the wiring of the connector 106 between the joysticks 108 and 110 can be utilized. Since the test tool simulates the actions of the joystick, one side of the test tool is designed to be connected to the connector 106 and the other side can be designed, in a simple manner, to simulate the actions. For instance, since the change in the X-coordinate displacement of the joystick is indicated by the change in the resistance value of the corresponding potentiometer, a resistor of a fixed resistance value may be used in the test tool. For the joystick buttons, the pressing or releasing of them corresponds to pins short- or open-circuited respectively. Therefore, in the test, making certain pins of the test tool short-circuited or open-circuited can simulate pressed or released states of the joystick buttons.

Figure 3:
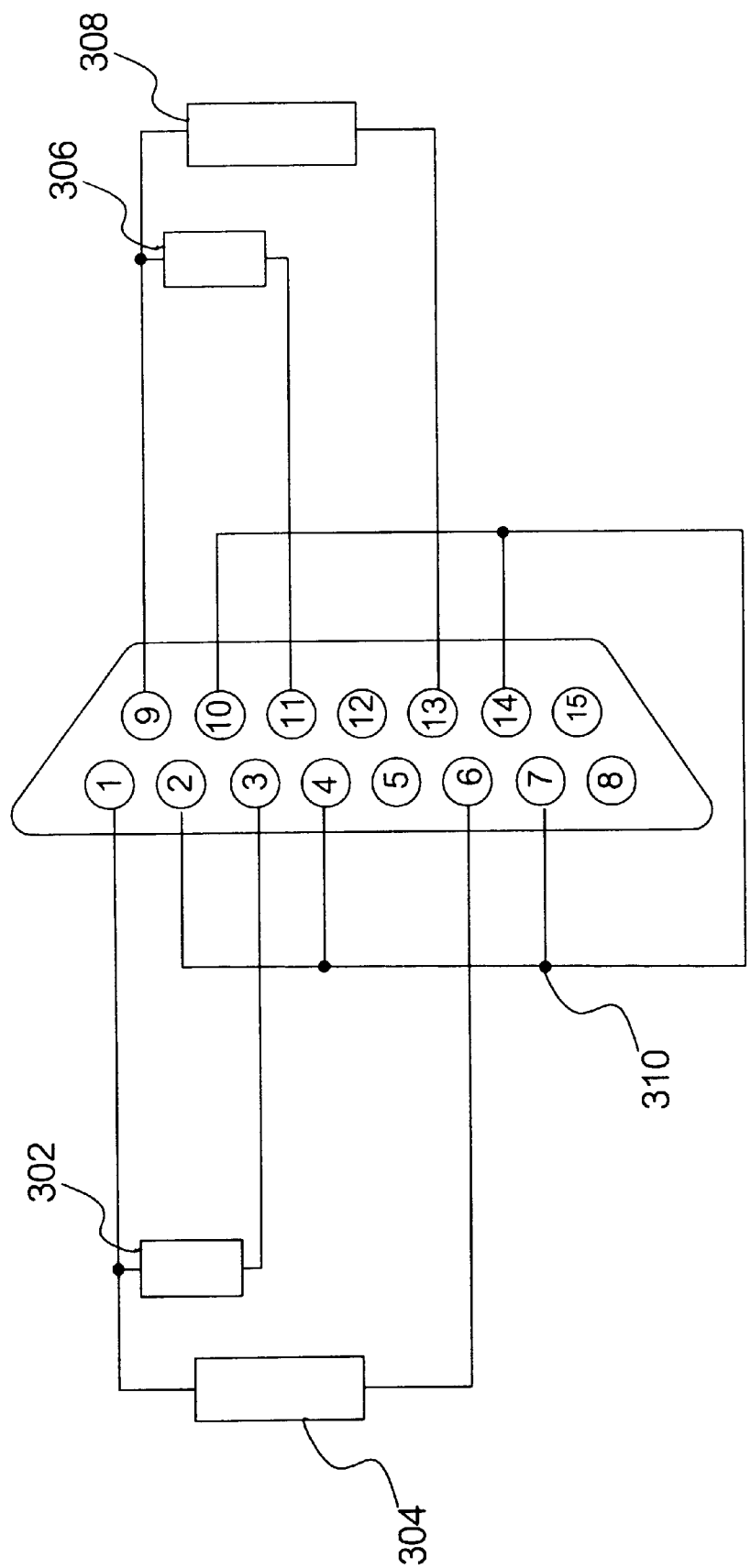
FIG. 3 is the circuit diagram of the test tool for testing the processing circuit for joystick buttons according to a preferred embodiment of the invention.

Using the characteristics of the joystick described above, the test tool is designed for simulating the actions of a joystick. Referring now to FIG. 3, it illustrates the circuit diagram of the test tool for testing the processing circuit for joystick on a main board according to a preferred embodiment of the invention. The test tool is connected to the connector 106 for simulating the actions of the joysticks 108 and 110. Like connector 106, the test tool contains 15 pins, each of which corresponds to the 15 pins of the connector 106. As for simulating the X- and Y-coordinate displacement of the joysticks in the test, the following wiring in the test tool is adopted. First, a fixed resistor 302, representing the X-potentiometer 202, is connected between pins 1 and 3, while a fixed resistor 304 is connected between the pins 1 and 6, representing the Y-potentiometer 204. Another fixed resistor 306 is connected between the pins 9 and 11, representing the X-potentiometer 212. Finally, a fixed resistor 308 is connected between the pins 9 and 13, representing the Y-potentiometer 214.

For the test of joystick buttons, the following operations are considered. As shown in FIG. 2, pressing or releasing joystick buttons makes a pair of pins short- or open-circuited respectively. For instance, when the button 206 is depressed, pins 2 and 4 of the connector 106 are short-circuited and when it is released, the pins are open-circuited. Similarly, the pressed and released states of the buttons 208, 216, and 218 correspond to the connector 106 in the way that the button 206 does. Specifically, their wiring with the connector 106 is as follows. Button 208 is associated with pins 4 and 7, button 216 with pins 4 and 10, and button 218 is associated with pins 4 and 14.

For the purpose of testing the processing circuit of the main board related to joystick buttons, there are many approaches for simulating the pressed or released states of the joystick buttons. In one approach, for simulating all buttons being depressed, all that is needed is to short the pin pairs mentioned above. As for simulating all buttons being released, all that is required is to make the same pairs of pins open-circuited.

Referring now to FIG. 3, it illustrates the test tool connected to the connector 106 and also the wiring which simulates all joystick buttons being depressed. The short-circuit node 310 is the common node that all the pins, including pins 2, 4, 7, 10, and 14, are connected to. When the test tool is connected with the connector 106, the status values stored in the status register of the game adapter 104 are detected. Since it is the simulation of all buttons in the pressed state, each value of bits 4 to 7 of the status register is expected to be 0 theoretically. If it is detected that any of the bits is not equal to 0, it is indicative of the processing circuit for the joystick buttons being defective.

After the above detection is done, the test tool is disconnected from the connector 106. This simulates the release of all joystick buttons since all the pairs of pins are now in the state of open circuits. In this situation, theoretically, each value of bits 4 to 7 is to be 1. Thus, it can be determined whether the processing circuit for joystick buttons is functioning properly by detecting the value of each of bits 4 to 7. If the value of any of the bits is not equal to 1, it indicates the processing circuit for joystick buttons is defective.

In summary, when the test tool is connected to the connector 106, the value of each of the bits 4 to 7 of the status register is 0. After the test tool is removed from the connector 106, the value is 1. According to these conditions, it can be determined whether the processing circuit for joystick buttons is functioning properly. If any one of these two conditions failed, it indicates that the processing circuit for joystick buttons in the main board malfunctions and the main board is regarded as a malfunctioning one.

In the conventional approach to the test of the joystick related circuit, the testing of the X- and Y-coordinate displacement of joysticks includes test steps, such as connecting the test tool, detecting the status values, and disconnecting the test tool, etc. As for the test of the processing circuit for joystick buttons, the invention provides a test tool described in the above and contains test steps similar to those employed conventionally. As such, the testing of the circuit on the main board responsible for the joystick buttons may be performed during the test of the circuit for processing X- and Y-coordinate displacement of joystick for a main board. Thus, according to the invention, the whole test, both for the displacements and the buttons, does not involve additional time.

In short, one feature of the invention is that it requires no additional time for the whole test. In addition, the actions of the joystick buttons being pressed or released are simulated simply by connecting or disconnecting the test tool. Specifically, connecting the test tool simulates all buttons being pressed and disconnecting the test tool simulates all buttons being released. Thus, it is simple to design the test tool for testing the circuit for processing the joystick buttons. Moreover, only two steps are necessary to complete the whole test. Therefore, the invention results in a more cost-effective and efficient test.

While the invention has been described by way of example and in terms of the preferred embodiment, it is to be understood that the invention is not limited to the disclosed embodiment. To the contrary, it is intended to cover various modifications and similar arrangements and procedures, and the scope of the appended claims therefore should be accorded the broadest interpretation so as to encompass all such modifications and similar arrangements and procedures.

What is claimed is:

1. An apparatus for testing a processing circuit for joystick buttons, outputting signals of a plurality of buttons of a joystick into the processing circuit in a main board for testing, wherein the processing circuit is coupled to the joystick through a connector, the connector contains M pins, and N pins of the M pins are used for connecting with the joystick buttons, the apparatus comprising:

a test tool comprising M pins, wherein the M pins respectively correspond to the M pins of the connector for coupling the test tool to the connector; and a short-circuit node, which is the common node of the N pins of the test tool that are all short-circuited, for simulating the actions of the joystick buttons.

2. The apparatus according to claim 1, wherein the M pins of the connector comprises:

pin 2, connecting to a first button of the joystick;

pin 3, connecting to a X-potentiometer of the joystick;

pin 6, connecting to a Y-potentiometer of the joystick;

pin 7, connecting to a second button of the joystick;

pin 1, connecting to a voltage supply, and pin 4, connecting to a ground.

3. The apparatus according to claim 2, wherein the N pins comprises the pins 2, 4, and 7.

4. The apparatus according to claim 1, wherein the processing circuit comprises a bus of the main board, a game adapter, and the connector.

5. An apparatus for testing a processing circuit for joystick buttons, outputting signals of a plurality of buttons, X-coordinate position control, and Y-coordinate position control of a joystick into a processing circuit in a main board for testing, wherein the processing circuit is coupled to the joystick through a connector, the connector comprises M first pins, and N pins of the M first pins are used for connecting with the joystick buttons, the apparatus comprising:

a test tool comprising M second pins, wherein the M second pins respectively correspond to the M first pins of the connector for coupling the test tool to the connector and N pins of the M second pins correspond to the N first pins of the connector respectively; and a short-circuit node, which is the common node of the N second pins that are all short-circuited, for simulating the actions of the joystick buttons.

6. The apparatus according to claim 5, wherein the M first pins of the connector comprises:

pin 2, connecting to a first button of the joystick;

pin 3, connecting to a X-potentiometer of the joystick;

pin 6, connecting to a Y-potentiometer of the joystick;

pin 7, connecting to a second button of the joystick;

pin 1, connecting to a voltage supply; and pin 4, connecting to a ground.

7. The apparatus according to claim 6, wherein the N second pins comprises the pins 2, 4, and 7.

8. The apparatus according to claim 6, wherein each of the pair of pins that comprises the pins 1 and 3, and the pins 1 and 6 are connected through an individual resistor for each of the pairs.

9. The apparatus according to claim 5, wherein the processing circuit comprises a bus of the main board, a game adapter, and the connector.

10. A method for testing a processing circuit for joystick buttons, outputting signals of a plurality of buttons, X-coordinate position control, and Y-coordinate position control of a joystick into the processing circuit in a main board for testing, wherein the processing circuit is coupled to the joystick through a connector, the connector contains M pins, and N pins of the M pins are used for connecting with the joystick buttons, the method comprising the steps of:

setting the N pins corresponding to the connector short-circuited in a test tool;

connecting the test tool with the connector and detecting status values stored in a status register corresponding to the joystick buttons; and disconnecting the test tool from the connector and detecting the status values stored in the status register corresponding to the joystick buttons.

11. The method according to claim 10, wherein the status register comprises the following bits:

bit 0, storing the status value of a X-potentiometer of the joystick;

bit 1, storing the status value of a Y-potentiometer of the first joystick;

bit 4, storing the status value of a first button of the joystick; and bit 5, storing the status value of a second button of the joystick.

12. The method according to claim 11, wherein the normal value of each of bits 0, 1, 4, and 5 is 0 when the test tool is connected to the pins 1, 2, 3, 4, 6, and 7 of the connector, and the normal value of each of bits 0, 1, 4, and 5 is 1 when the test tool is disconnected from the connector.

13. The apparatus according to claim 1, wherein the M pins of the connector comprise:

pin 10, connecting to a first button of the joystick;

pin 11, connecting to a X-potentiometer of the joystick;

pin 13, connecting to a Y-potentiometer of the joystick;

pin 14, connecting to a second button of the joystick;

pins 9, connecting to a voltage supply; and pins 5, connecting to a ground.

14. The apparatus according to claim 13, wherein the N pins comprise pins 10 and 14.

15. The apparatus according to claim 5, wherein the M pins of the connector comprise:

pin 10, connecting to a first button of the joystick;

pin 11, connecting to a X-potentiometer of the joystick;

pin 13, connecting to a Y-potentiometer of the joystick;

pin 14, connecting to a second button of the joystick;

pins 9, connecting to a voltage supply; and pins 5, connecting to a ground.

16. The apparatus according to claim 15, wherein the N second pins comprise the pins 10 and 14.

17. The apparatus according to claim 15, wherein each of the pair of pins that comprises the pins 9 and 11, and the pins 9 and 13 are connected through an individual resistor for each of the pairs.

18. The method according to claim 10, wherein the status register comprises the following bits:

bit 2, storing the status value of a X-potentiometer of the joystick; bit 3, storing the status value of a Y-potentiometer of the joystick; bit 6, storing the status value of a first button of the joystick; and bit 7, storing the status value of a second button of the joystick.

19. The method according to claim 11, wherein the normal value of each of bits 2, 3, 6, and 7 is 0 when the test tool is connected to the pin 5, 9, 10, 11, 13, and 14 of the connector, and the normal value of each of bits 2, 3, 6, and 7 is 1 when the test tool is disconnected from the pin 5, 9, 10, 11, 13, and 14 of the connector.

* * * * *